(12) United States Patent
Pagenkopf

(10) Patent No.: US 6,218,913 B1
(45) Date of Patent: Apr. 17, 2001

(54) COAXIAL TOROID EMI FILTER WITH DISCRETE CAPACITORS SURROUNDING CONDUCTORS

(75) Inventor: Kenneth E. Pagenkopf, Milwaukee, WI (US)

(73) Assignee: Curtis Industries, a division of Powers Holatings, Inc., Milwaukee, WI (US)

( * ) Notice: Subject to any disclaimer, the term of this patent is extended or adjusted under 35 U.S.C. 154(b) by 0 days.

(21) Appl. No.: 09/251,817

(22) Filed: Feb. 17, 1999

Related U.S. Application Data
(60) Provisional application No. 60/075,068, filed on Feb. 18, 1998.

(51) Int. Cl.⁷ .................................................. H03H 7/01
(52) U.S. Cl. ............................ 333/181; 333/185; 307/105
(58) Field of Search .............................. 333/12, 167, 175, 333/181, 182, 185; 307/105

(56) References Cited

U.S. PATENT DOCUMENTS

| | | | |
|---|---|---|---|
| 4,725,739 | 2/1988 | McCartney et al. | 333/185 X |
| 4,761,623 | 8/1988 | Schneider | 333/167 |
| 5,083,101 | 1/1992 | Frederick | 333/181 |
| 5,153,539 | 10/1992 | Hara et al. | 333/182 |
| 5,243,308 | 9/1993 | Shusterman et al. | 333/181 |
| 5,444,609 | 8/1995 | Swamy et al. | 363/47 |
| 5,461,351 | * 10/1995 | Shusterman | 333/181 |
| 5,635,890 | 6/1997 | Yamaguchi et al. | 336/83 |
| 5,650,759 | * 7/1997 | Hittman et al. | 333/182 |
| 5,838,216 | * 11/1998 | White et al. | 333/182 |

* cited by examiner

Primary Examiner—Justin P. Bettendorf
(74) Attorney, Agent, or Firm—Godfrey B Kahn, S.C.; William K. Baxter

(57) ABSTRACT

An electromagnetic interference filter for reducing conducted noise for alternating current power lines, wherein a compact component geometry integrates matched material characteristics to create a coaxial inductor and square axi-symmetric capacitor configuration capable of providing reduced size, increased frequency performance and improved voltage isolation over traditional magnet wire construction methods.

14 Claims, 4 Drawing Sheets

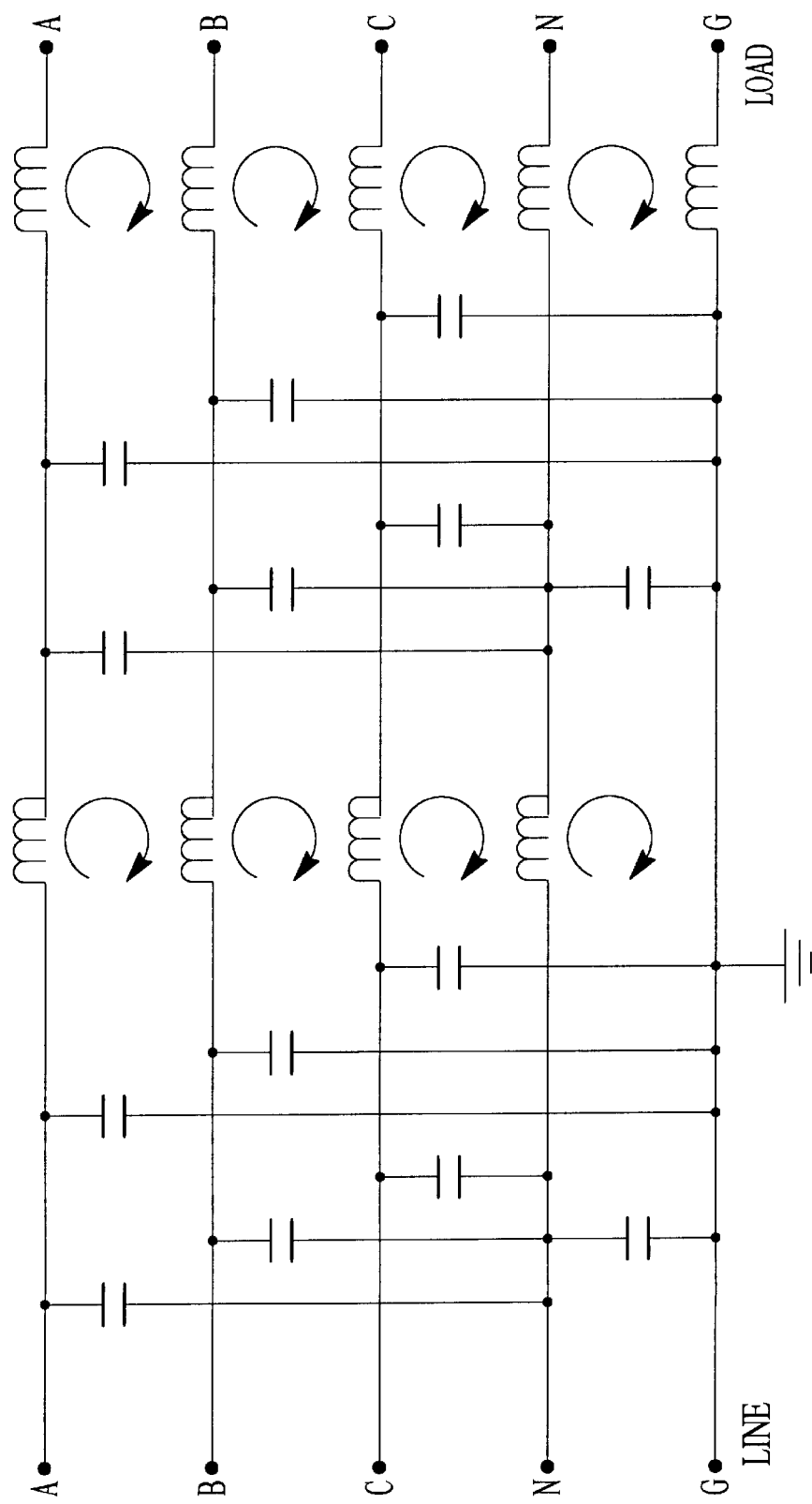

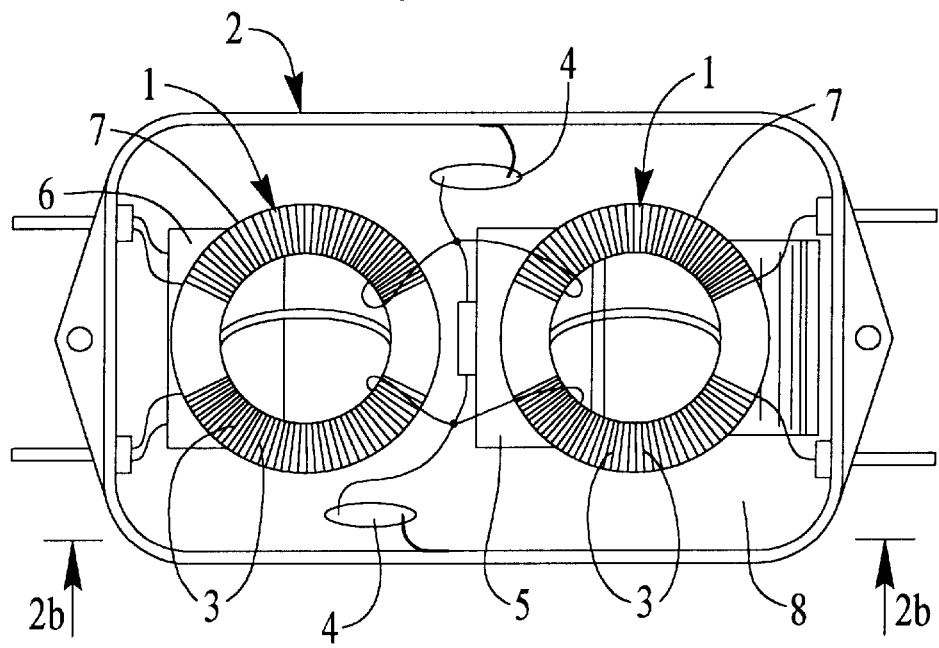
FIG_2a
PRIOR ART
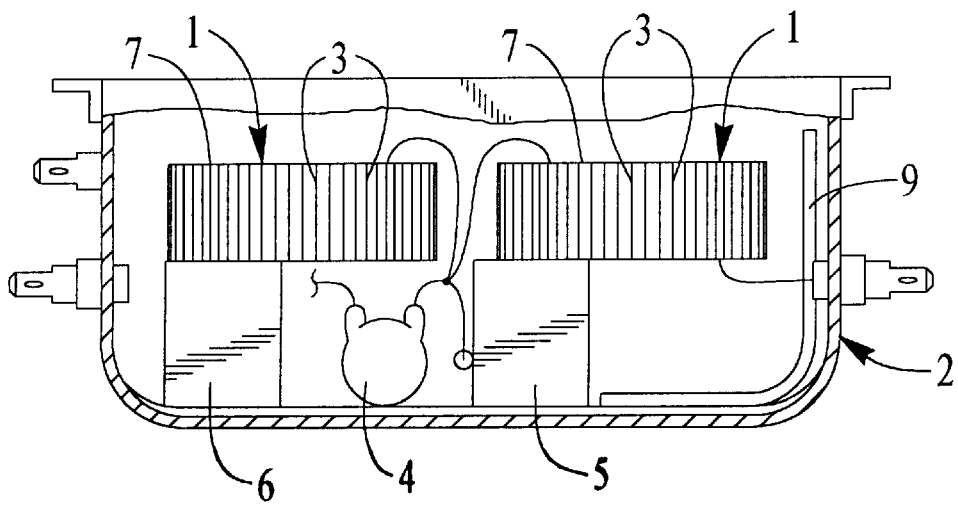
FIG_2b
PRIOR ART

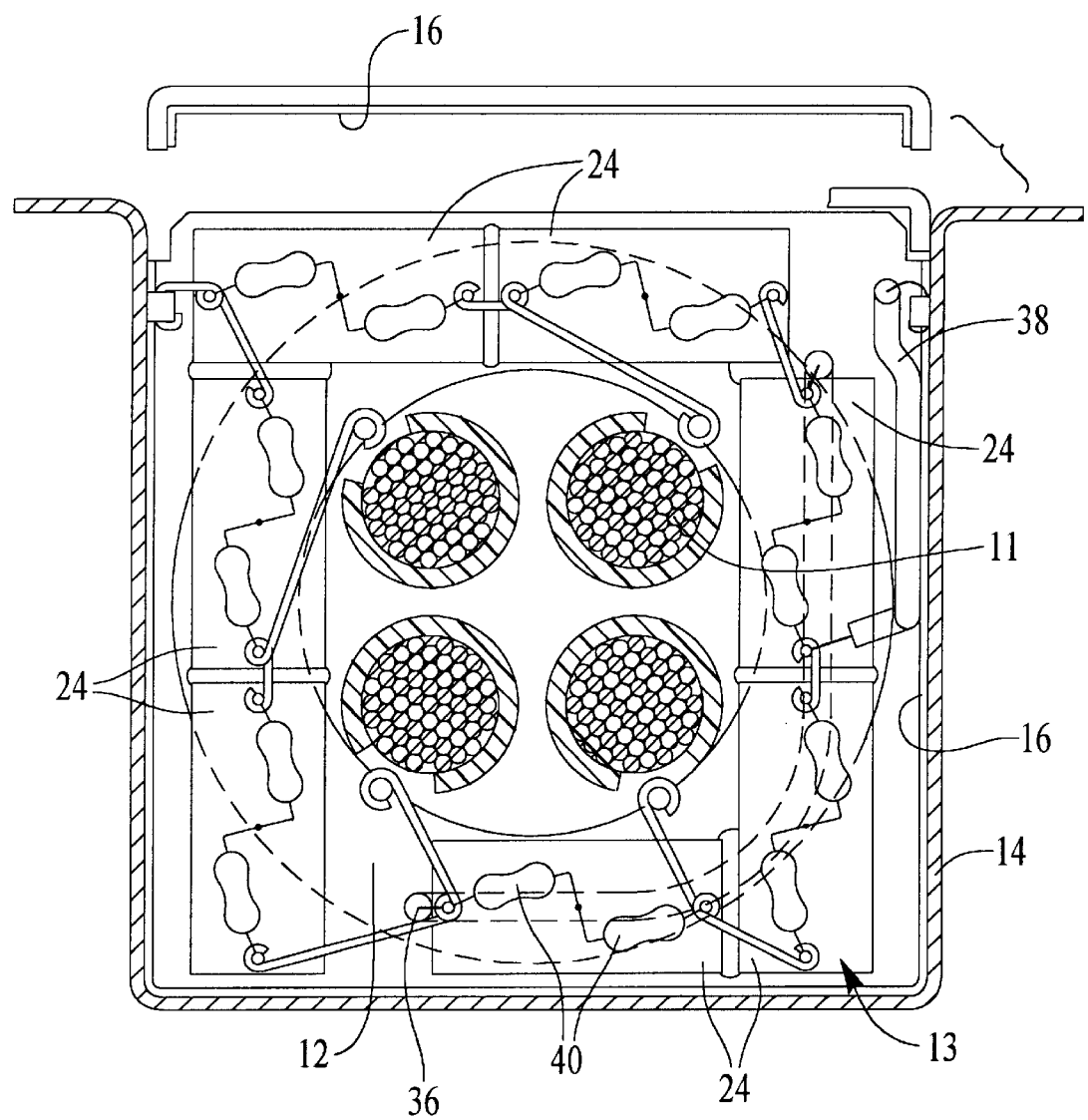
FIG_4

COAXIAL TOROID EMI FILTER WITH DISCRETE CAPACITORS SURROUNDING CONDUCTORS

CROSS-REFERENCE TO RELATED APPLICATION

This application claims the benefit of the filing date of U.S. Provisional Application Ser. No. 60/075,068, filed Feb. 18, 1998.

BACKGROUND OF THE INVENTION

The present invention relates to reduction of conducted electromagnetic interference (EMI) on alternating current (AC) power lines utilizing frequency domain filters of lumped parameters having significant physical structure comprising inductor devices with core(s) surrounding linear conductors.

The use of inductor-capacitor (L-C) filtering to remove conducted EMI noise in the frequency band previously mentioned is widely accepted.

Schematics of three-phase filters, such as that shown in FIG. 1, are relatively standard in the industry and it is well understood that the inductors have increasing reactance and the capacitors have decreasing reactance as frequency increases, thereby impeding and shunting the high frequency noise to minimum values.

Some basic formulas should be noted which will further the design discussions which follow:

$$I_{max} = 10 * B_{max} * A_e / N * A_l \qquad (1)$$

Where:
$I_{max}$=Peak saturation current (A)
$B_{max}$=Maximum flux density (G)
$A_e$=effective core area (sq. cm)
$A_l$=inductance index (mH/1000 Turns)
N=Turns $$L = n * A_l (N/1000)^2 \qquad (2)$$

Where:
L=inductance (mH)
n=number of magnetic cores $$C = 1/(6.28 f_0)^2 L \qquad (3)$$

Where:
$f_0$=center frequency (Hz)
C=capacitance (F)
L=inductance (H)

The physical layout and component types in 3-phase filters usually adhere to standard filter design and construction methods which have certain disadvantages. An example of such a prior art filter is shown at FIGS. 2a and 2b, where a pair of cores 1 are shown positioned in a housing 2. FIG. 2a is a top plan view, while FIG. 2b is a cross-sectional view of the filter shown in FIG. 2a, taken generally along line 2b—2b, to have the effect of a side elevational view of the filter with the side of the housing 2 removed. In the filter shown in these figures, wires 3 are wound or wrapped around cores 1 multiple times to result in an inductor 7 having an inductance determined by the properties of the cores and the number of wraps. Capacitors 4, 5 and 6 are connected between the inductors 7 and neutral, and between the inductors and ground, to constitute a completed filter circuit as shown schematically in FIG. 1. Mylar 9 provides necessary insulation, and encapsulation material 8 provides both component mounting and insulation. Resistors 10 act as bleed resistors to bleed any residual voltage off the capacitors 4, while not affecting filter performance.

In higher current applications (180–600 A), inductors are usually constructed of several parallel turns of magnet wire wound around a medium (1–4k) permeability core. The wires themselves can be heavy and difficult to bend to form windings around brittle ferrite cores without breaking the wires, the cores, or both. The soldered, clamped or crimped connections to these inductors can also contribute to filter overheating.

Inductor and capacitor component values must be selected such that proper low pass cutoff frequencies are realized. To keep leakage current low, line-to-ground capacitors are usually kept small, thus driving up the size of the inductance, and consequently the size of the inductors.

The placement of the capacitors is driven by the inductor lead location, which often requires long leads. Leads that are too long can compromise high frequency filtering and poor location can cause high voltage isolation problems.

The present invention is directed toward relieving the aforementioned problems.

SUMMARY OF THE INVENTION

To avoid the limitations with conventional devices, the present invention provides a combination of insulated wires, large ferrite toroid cores and a capacitor ring, which provides significant (20–120 dB) attenuation of EMI noise in a compact, integrated, shielded package.

To eliminate the need for winding magnet wire, the inductors used herein are comprised of a group of toroidal ferrite cores, with power conductors simply passing through the center, once. Permeabilities of the ferrites are as high as presently possible in this size (greater than 4k) (referred to as "high $\mu$ permeability"), generating proper saturation fluxes even with only one turn. The single pass-through also eliminates solder or crimp connections in the power conductor, which allows the filter to run cooler or use smaller power conductor wire sizes.

The utilization of toroidal ferrite cores as common mode inductors, by passing through the center once, takes advantage of the physical properties of toroids which allow a single pass-through to create one full turn. Additionally, all conductors which carry current are enclosed in the toroid center. By means of basic closed circuit analysis, it can be seen that the net current, and consequently the net flux, is therefore equal to zero. This allows all normal circuit currents to create canceling flux. Thus, unbalanced noise current contributes to the toroid core saturation, in turn allowing higher inductance from higher permeability materials.

The utilization of toroidal ferrite cores as differential inductors takes advantage of the increased leakage inductance resulting from the reduced coupling which accompanies the single turn pass-through configuration. Therefore, differential mode filtering is achieved without the primary use of separate differential inductors. However, the differential inductance can be enhanced by use of separate properly sized and chosen iron powder cores on each of the conductors singly.

To achieve minimum component size, and thus minimum filter size, the inductor and capacitor values are selected and matched so that, as well as meeting the appropriate low pass cut-off frequencies, the two part types remain volumetrically similar. The best volumetric match will likely lead to higher than usual capacitor values. Higher capacitor values result in higher leakage currents, making the filter provided by this invention possibly less suitable as an appliance filter. As a facility or power device filter, however, this configuration is well suited. To improve the high frequency filtering and high voltage isolation, a pass-through square axisymmetric capacitor ring is created, mimicking the physical arrangement of the pass-through inductors in a coaxial fashion. As the line-to-line and line-to-ground capacitor values are the same, a compact ring of capacitors of a uniform size and shape is formed around the conductors. This capacitor ring allows component leads to remain short to minimize series inductance to the capacitors, addressing high frequency concerns and still providing sufficient length and separation to maintain required conductor to conductor spacings, addressing high voltage concerns.

To reduce EMI radiated emissions, a shield is fitted tightly around the coaxial components. This arrangement not only reduces outgoing radiated noise, but also minimizes the tendency of electromagnetic fields to bypass internal components, which would compromise high frequency performance.

These and other objects of the invention are provided by a novel integration of coaxial inductors and axisymmetric capacitor rings surrounding linear conductors.

BRIEF DESCRIPTION OF THE DRAWING

FIG. 1 is a schematic diagram of a conventional 3-phase, 5 wire WYE connected 2-stage filter.

FIG. 2a is a top plan view of a prior art high voltage EMI filter.

FIG. 2b is a cross sectional view of the prior art high voltage EMI filter shown in FIG. 2a, taken generally along line 2b—2b.

FIG. 4 is a cross sectional view of a filter as shown in FIG. 3, taken generally along line 4—4.

DESCRIPTION OF THE PREFERRED EMBODIMENT

Figure 3:
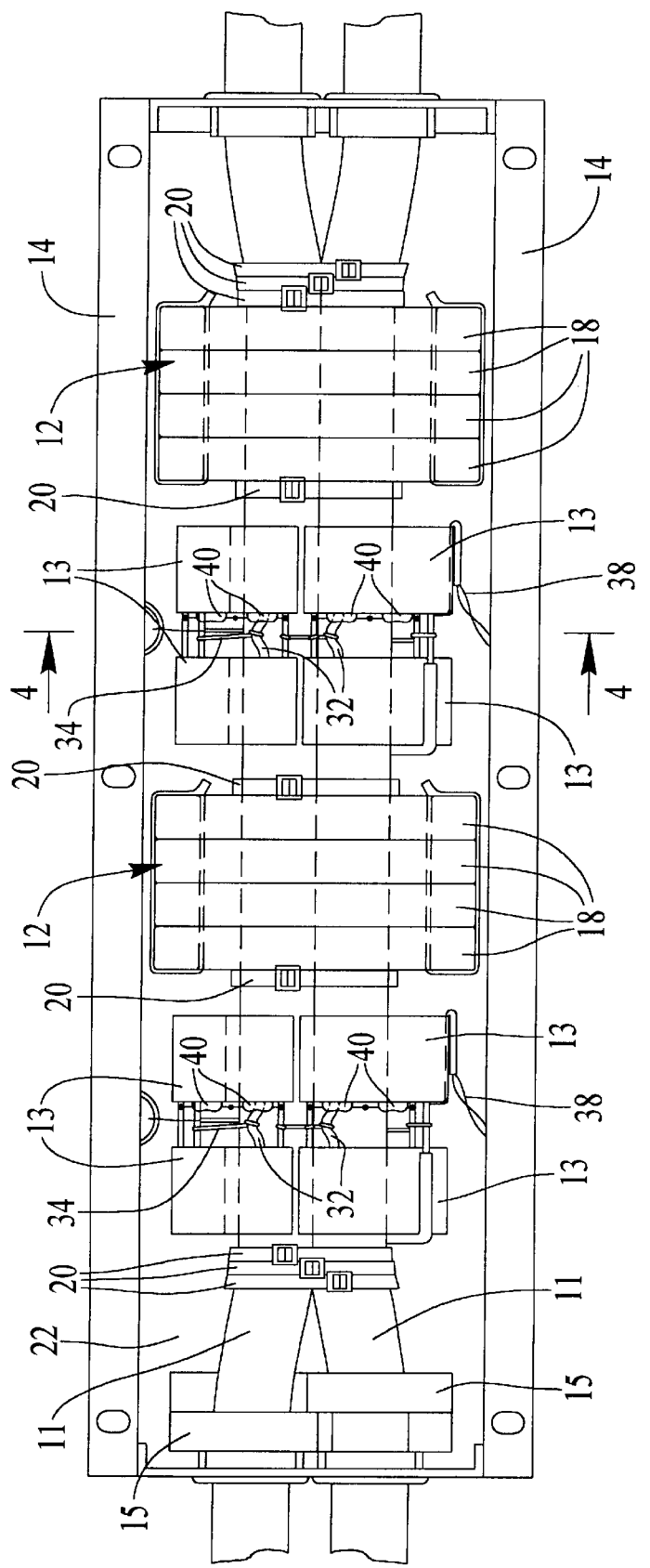
FIG. 3 is a top plan view of a high voltage EMI filter constructed according to a preferred embodiment of the present invention.

A preferred embodiment of the EMI filter assembly which is the subject of this invention is shown in FIGS. 3 and 4. In the embodiment shown there, four conductors 11 remain unbroken as they are passed through toroid cores 12, capacitor rings 3 and a metal housing 14. Each conductor 11 carries a separate, respective one of three phases A, B, C, and a neutral, in a 3-phase WYE connected 600V system. The four conductors are mechanically bound together by any suitable means such as wire ties 20. Conventional encapsulation material 22 provides component mounting within the housing 14, insulation, and prevents components from shifting.

The conductors 11 are gauge 500MCM type MTW, rated for 600 A operation with 25° C. to 35° C. temperature rise. The conductors are of an insulated wire rated for 600V.

The toroid cores 12 are made from 6k permeability ferrite material (Philips p/n T102/66/15-3E25). In the most preferred embodiment, there are four toroid plates 18 making up each core 12. Each such core 12 of four toroid plates 18 has a calculated single turn DC saturation current ($I_{max}$) of 14.5 A. This relates to a 140 dB $\mu$V noise level through effective load impedance. An applied voltage of 600V, delivering 600 A, gives an effective 1 ohm load. A noise level of 140 dB $\mu$V converts to 10V which, when sourced from a 1 ohm load to a short circuit, results in a current of 10 A. Thus, this saturation noise current matches the expected noise levels.

The size and quantity of toroid core plates 18 making up each core 12 establishes the common-mode inductance (L). For a core 12 constructed from four toroid core plates 18, as shown in FIG. 3, the common-mode inductance L is 33 $\mu$H. This toroid core construction also exhibits a leakage inductance of approximately 2 $\mu$H per section due to the single pass-through configuration. This arrangement results in a sufficient but diminished differential-mode performance. In this embodiment the differential-mode performance can be enhanced if desired by the addition of iron powder cores 15 (Micrometals p/n T200-18) on each conductor line. These additional cores may not be necessary, especially in lower current applications. With these iron powder cores 15 in place, the calculated saturation current is 815 A, which provides a safety margin to 600 A, and affords 67 nH of differential-mode inductance per line.

To reduce noise in the 150 kHz to 30 MHz band from 140 dB $\mu$V to 60–80 dB $\mu$V, a center frequency ($f_0$) of 44 kHz was chosen for a two-stage common-mode filter. This frequency and the calculated inductance forces the capacitance (C) to be 0.4 $\mu$F per stage.

To realize this level of capacitance, the capacitors 13 used in the most preferred embodiment are pairs of 0.22 $\mu$F metalized paper film type (Wima p/n MKP10/0.22 $\mu$F/2000V DC) which have a good frequency range of performance, the ability to withstand high noise current and a 1-minute dielectric withstanding test voltage of 3200 V DC. Any suitable film-type capacitor may also be used possibly including capacitors constructed using mylar film, polyester film and polycarbonate film. The capacitors are located adjacent to the toroid cores 12 in each filter stage, spaced longitudinally along the conductors 11.

The inductance and capacitance values calculated above are used for line-to-line and line-to-ground applications in a standard 3-phase WYE connected L-C filtering configuration as shown in FIG. 1.

This allows each capacitor ring 13 to be made up of seven identical capacitors 24 as shown in FIG. 4. Since there are two capacitor rings 13 for each section of the filter, as shown in FIG. 3, this embodiment calls for a total of fourteen capacitors 24 per section. The quantity of toroid core plates 18 and the value of the capacitors 24 are uniquely selected to achieve similar volume of the capacitor ring 13 and toroid core 12.

As the inductance can easily be increased by adding more toroid core plates 18 without impacting saturation, inductor/capacitor ratios can be manipulated for minimal size and the expected frequency band of filtering performance.

The arrangement of the capacitors 24, as herein described, places each of the capacitor connections proximal to the connection for its adjacent capacitor. Each connection to the power conductors 11 is located as close as practical to that power conductor. The power conductors 11 used are made up of several wire strands 26 all surrounded by a layer of insulation 28. The insulation 28 is notched only at the capacitor connection point 30, and one strand 32 is lifted to provide a hook to which a capacitor lead 34 is soldered.

The proximity of the capacitor ring 13 to both power conductor 11 and housing 14 permits the leads 34 to be kept short to improve high frequency filtering, enabling the filter to achieve the expected capacitor and inductor performance characteristics. Each component type has some reduction in performance, beginning in the low megahertz range, which corresponds well to ½" to 1" component lead lengths. Only the neutral lead 36 and one ground lead 38 are longer, and they are supplied in the form of a larger gauge (preferably #10 AWG) insulated wire to lower series inductance and allow special routing.

Spacing of adjacent conductors to accommodate 600V is controlled by Underwriters Laboratories specification UL1283, which requires a 0.375" minimum spacing. This specification also requires ½" creep distances between conductors. The same specification requires a 600V AC filter to withstand 3150V DC, so high voltage clearances are critical. The location and positioning of the capacitors 24 forming the capacitor ring 13 as provided by the present invention afford natural spacings which exceed these requirements. Again the same specification permits the usage of mylar film 16 as an insulating medium to reduce spacings. Thus, in the embodiment shown in FIG. 4, mylar film 16 is used between the capacitor ring 13 and the housing 14.

The housing 14 is made of plated steel and is as small as the toroid core 12 and capacitor ring 13 will allow. The embodiment shown in FIGS. 3 and 4 is square in cross section and is made from tin-plated steel 0.06" thick to provide electromagnetic shielding and corrosion protection.

Resistors 40 act as charge bleeders for the capacitors and do not appear in filtering performance.

The described embodiment discloses a 600A filter. Another embodiment for a 300A filter would use AWG 3/0 MTW conductors 11, six ferrite core plates 18 per section for the cores 12, (Magnetics p/n OW-48613-TC) for 66 $\mu$H of inductance, and seven 0.22 $\mu$F capacitors 24 (Wima p/a MKP10/0.22 $\mu$F/2000V DC) for each capacitor ring 13. Another embodiment for 180 A would use AWG 2 MTW conductors 11, five ferrite core plates 18 for each core 12 (Magnetics p/n OW-46113-TC) for 68 $\mu$H of inductance, and fourteen 0.1 $\mu$F capacitors 24 for each capacitor ring 13 (Rifa p/n PME264NE6100M).

In another embodiment of the invention, referring again to FIG. 4, power conductors 11 could be replaced with bus bars, braided wire, screws or rods, insulated or not. Wire notch locations are a matter of design choice. The toroid cores 12 can vary in size and permeability as required. Connections to the capacitor ring 13 can be reorganized and attached by any suitable type of conductor. These capacitors can be any suitable type of film or mica that has adequate characteristics in the required frequency range. They also may have different values as long as desired filtering is accomplished and all parts fit around the ring.

The housing 14 could be made of any electromagnet shielding material ranging from filled polymers to mu-metal. It is possible to build a suitable filter without bleeder resistors 15. The potting or encapsulation 22 can be omitted using alternate component securing. The mylar 16 can be applied in different ways, providing voltage isolation is maintained.

The frequency range can be adjusted to any band of interest and the current rating can be ranged beyond the 180–600 A range specified where the pass-through coaxial configuration is efficient to utilize. Note, as higher permeability ferrites become available, this topology can be constructed for lower currents. At lower voltages (below 600V AC) the capacitor size is smaller relative to the toroidal ferrite cores. This permits the construction of another embodiment for lower voltage applications. Additionally, lower noise levels drive down inductor size and would allow this configuration to be used for low noise applications.

In another embodiment, a 3-wire 3-phase delta system or a 2-wire 1-phase system can utilize a similar coaxial toroid/capacitor configuration.

In other embodiments, instead of being electrically connected as shown in the schematic in FIG. 1, which shows a standard double L-C stage, a filter constructed according to the invention may be constructed as a subpart thereof, including a single L-C stage in L configuration, a single L-C-L stage in T configuration, or a single C-L-C stage in $\pi$ configuration. A filter constructed according to the invention may also be constructed of multiple stages of the configurations described herein.

Although the invention has been herein shown and described in what is perceived to be the most practical and preferred embodiments, it is to be understood that the invention is not intended to be limited to those specific embodiments. Rather, it is recognized that modifications may be made by one of skill in the art without departing from the spirit or intent of the invention. Therefore, the invention is to be taken as including all reasonable equivalents to the subject matter of the appended claims.

I claim:

1. An inductor-capacitor electromagnetic interference filter, comprising:

a housing;

at least two conductors arranged generally parallel to each other and longitudinally within the housing along a longitudinal axis;

at least one toroidal core positioned within the housing and having the conductors passed therethrough, thereby together with the conductors forming an inductor;

a plurality of discrete capacitors positioned within the housing and arranged in a ring around the longitudinal axis of the conductors;

wherein the inductors and capacitors are connected to each other so as to form an electromagnetic interference filter; and wherein at least one of the capacitors is connected between each conductor and neutral, at least one of the capacitors is connected between each conductor and ground, and at least one of the capacitors is connected between neutral and ground.

2. A filter as recited in claim 1 wherein the capacitors are arranged axisymmetrically about the conductors.

3. A filter as recited in claim 1 wherein the filter comprises two sets of capacitors and two cores, each core and set of capacitors arranged in a stage, so that the multiple sets provide filtering in stages.

4. A filter as recited in claim 1 further comprising an additional core applied separately to each conductor line.

5. An inductor-capacitor electromagnetic interference filter, comprising:

a housing;

at least two conductors arranged generally parallel to each other and longitudinally within said housing along a longitudinal axis;

at least one toroidal core positioned within the housing and having the conductors passed therethrough, thereby together with the conductors forming an inductor;

a plurality of capacitors positioned within the housing and spaced generally about the longitudinal axis of the conductors;

wherein the inductors and capacitors are connected to each other so as to form an electromagnetic interference filter; and wherein at least one of the conductors is a stranded conductor, and wherein at least one of the capacitors is electrically connected to the stranded conductor by the lifting of at least one strand and electrically connecting the strand to the capacitor.

6. An electromagnetic filter for filtering noise from high-voltage, high-current power lines and mounted within a housing, the filter comprising:

a toroidal core mounted inside the housing;

at least two conductors passing uninterrupted through the housing, including passing uninterrupted through the core; and a set of discrete capacitors also mounted inside the housing and arranged about the conductors proximally adjacent to the core longitudinally along the conductors, at least one of the capacitors is electrically connected between each conductor and neutral, at least one of the capacitors is connected between each conductor and ground, and at least one of the capacitors is connected between neutral and ground so as to, with an inductor formed by the conductors and the core, filter a predetermined frequency of noise from the power lines.

7. A filter as recited in claim 6 wherein the capacitors are arranged in an axisymmetric ring about the conductors.

8. A filter as recited in claim 6 wherein the filter comprises at least two sets of discrete capacitors and at least two toroidal cores, arranged in stages, to provide filtering in stages.

9. An inductor-capacitor electromagnetic interference filter, comprising:

a housing;

at least two conductors arranged generally parallel to each other and longitudinally within said housing along a longitudinal axis;

at least one toroidal core of high $\mu$ permeability ferrite positioned within the housing and having the conductors passed therethrough, thereby together with the conductors forming an inductor;

a plurality of film capacitors positioned within the housing and spaced generally about the longitudinal axis of the conductors;

wherein the inductors and capacitors are connected to each other so as to form an electromagnetic interference filter; and wherein at least one of the conductors is a stranded conductor, and wherein at least one of the capacitors is electrically connected to the stranded conductor by the lifting of at least one strand and electrically connecting the strand to the capacitor.

10. An electromagnetic filter for filtering noise from high-voltage, high-current power lines and mounted within a housing, the filter comprising:

a toroidal core mounted inside the housing;

at least two conductors passing uninterrupted through the housing, including passing uninterrupted through the core;

a set of discrete capacitors also mounted inside the housing and arranged about the conductors proximally adjacent to the core longitudinally along the conductors, the capacitors respectively electrically connected to the conductors and to ground so as to, with the inductor formed by the conductors and the core, filter a predetermined frequency of noise from the power lines; and wherein at least one of the conductors is a stranded conductor, and wherein at least one of the capacitors is electrically connected to the stranded conductor by the lifting of at least one strand and electrically connecting the strand to the capacitor.

11. An inductor-capacitor electromagnetic interference filter, comprising:

a housing;

at least two conductors arranged generally parallel to each other and longitudinally within the housing along a longitudinal axis;

at least one toroidal core of high $\mu$ permeability ferrite positioned within the housing and having the conductors passed therethrough, thereby together with the conductors forming an inductor;

a plurality of discrete film capacitors positioned within the housing and arranged in a ring around the longitudinal axis of the conductors;

wherein the inductors and capacitors are connected to each other so as to form an electromagnetic interference filter; and wherein at least one of the capacitors is connected between each conductor and neutral, at least one of the capacitors is connected between each conductor and ground, and at least one of the capacitors is connected between neutral and ground.

12. A filter as recited in claim 11 wherein the capacitors are arranged axisymmetrically about the conductors.

13. A filter as recited in claim 11 wherein the filter comprises two sets of capacitors and two high $\mu$ permeability ferrite cores, each core and set of capacitors arranged in a stage, so that the multiple sets provide filtering in stages.

14. A filter as recited in claim 11 further comprising an additional high $\mu$ permeability ferrite core applied separately to each conductor line.

* * * * *

UNITED STATES PATENT AND TRADEMARK OFFICE
CERTIFICATE OF CORRECTION

PATENT NO. : 6,218,913 B1
DATED : April 17, 2001
INVENTOR(S) : Pagenkopf

Page 1 of 1

It is certified that error appears in the above-identified patent and that said Letters Patent is hereby corrected as shown below:

<u>Title page:</u>
Assignee: should read - "Curtis Industries, a Division of Powers Holdings, Inc."

Signed and Sealed this

Twenty-eighth Day of August, 2001

Attest:

NICHOLAS P. GODICI
*Attesting Officer*    *Acting Director of the United States Patent and Trademark Office*